United States Patent
Knox (10) Patent No.: US 6,459,278 B1
(45) Date of Patent: Oct. 1, 2002

(54) METHOD FOR CHARACTERIZING DELAY OF FREQUENCY TRANSLATION DEVICES

(75) Inventor: Michael E Knox, Manhasset, NY (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/040,197

(22) Filed: Dec. 19, 2001

Related U.S. Application Data (62) Division of application No. 09/558,301, filed on Apr. 25, 2000.

(51) Int. Cl.[7] .................. G01R 27/28; G01R 23/14; G01R 23/00; H04B 17/00

(52) U.S. Cl. ................ 324/617; 324/76.25; 324/76.19; 324/76.43; 324/615; 324/601; 324/622; 375/224; 375/227; 375/228

(58) Field of Search .................... 375/224, 227, 375/228; 324/601, 622, 76.23, 85, 615, 76.43, 617, 76.19

(56) References Cited

U.S. PATENT DOCUMENTS

| | | | |
|---|---|---|---|
| 4,716,362 A | * 12/1987 | Ambos et al. | 324/76.23 |
| 4,860,227 A | * 8/1989 | Tamamura | 702/112 |
| 5,038,096 A | * 8/1991 | Obie et al. | 324/76.23 |
| 5,089,782 A | * 2/1992 | Pike et al. | 324/623 |
| 5,119,399 A | * 6/1992 | Santos et al. | 375/224 |
| 5,309,477 A | * 5/1994 | Ishii | 375/224 |
| 5,321,364 A | * 6/1994 | Nukiyama et al. | 324/601 |
| 5,337,014 A | * 8/1994 | Najile et al. | 324/613 |
| 5,371,760 A | * 12/1994 | Allen et al. | 375/142 |
| 5,724,388 A | * 3/1998 | Nagano et al. | 375/224 |
| 5,784,299 A | * 7/1998 | Evers et al. | 702/85 |
| 5,937,006 A | 8/1999 | Clark et al. | 375/224 |
| 6,064,694 A | * 5/2000 | Clark et al. | 375/224 |

OTHER PUBLICATIONS

Ronald W. Schafer, "The Chirp z–Transform Algorithm"; Condensed version of a paper published in the Bell System Technical Journal, May 1969; IEEE Transactions on Audio and Electroacoustics, vol. AU–17, No. 2, Jun. 1969; pp. 86–92, Copy is in Case No. 09/558,301.

Dave Badger, "Low–Cost Techniques Determine Group Delay"; Microwaves & RF, Jan. 1985; pp. 83–86, Copy is in Case No. 09/558,301.

(List continued on next page.)

Primary Examiner—N. Le
Assistant Examiner—Wasseem H. Hamdan
(74) Attorney, Agent, or Firm—John L. Imperato (57) ABSTRACT

Absolute delay of a FTD is characterized by applying a stimulus signal to a first port of the FTD. A second port of the FTD is coupled to a delay element having a known delay and a reflective termination. A drive signal is applied to a third port of the FTD. A time domain reflection response to the stimulus signal is obtained and a signal peak within the response that corresponds to a return signal from the reflective termination is identified. Absolute delay of the frequency translation device is then extracted based on the known delay of the delay element and a time that corresponds to the occurrence of the identified signal peak. Delay versus frequency is characterized by isolating a segment of the obtained time domain reflection response that corresponds to a return signal from the reflective termination. Inverse frequency transforming the isolated segment of the time domain reflection response provides delay characteristics of the FTD versus frequency. Inherent transform/inverse transform relationships between the frequency domain and the time domain enables the delay characteristics of the FTD to be provided in equivalent alternative ways.

11 Claims, 6 Drawing Sheets

OTHER PUBLICATIONS

C. J. Clark, A. A. Moulthrop, M. S. Muha and C. P. Silva, The Aerospace Corporation, Los Angeles, CA; "Network Analyzer Measurement of Frequency–Translating Devices"; Microwave Journal, Nov. 1996; pp. 114, 116–118, 120,122, 124,126, Copy is in Case No. 09/558,301.

My Le Truong, Michael Knox, Joel Dunsmore—"Highly Accurate Absolute Group Delay Measurement Technique for Frequency–Translation Devices", 28th European Microwave Conference, Amsterdam, 1998; pp. 98–103, Copy is Case No. 09/558,301.

E. Oran Brigham, E–Systems, Inc.—"The Fast Fourier Transform"; Prentice–Hall, Inc., 1974; pp. 13–28, 91–94, 98–99, Copy in Case No. 09/558,301.

Doug Rytting, HP Network Measurement Division—"Let Time Domain Response Provide Additional Insight Into Network Behavior"; RF & Microwave Measurement Symposium and Exhibition, Copy in Case No. 09/558,301.

* cited by examiner

METHOD FOR CHARACTERIZING DELAY OF FREQUENCY TRANSLATION DEVICES

CROSS REFERENCE TO RELATED APPLICATION(S)

This is a divisional of copending application Ser. No. 09/558,301 filed on Apr. 25, 2000.

BACKGROUND OF THE INVENTION

Mixers, modulators and other frequency translation devices (FTDs) are ubiquitous in communication systems. Delay characteristics of FTDs influence the performance of communication systems in which the FTDs are included. For example, FTDs having nonlinear delay characteristics introduce distortion that can increase bit error rate of a communication system or otherwise corrupt integrity of information transmitted through the system. Modern communication systems that have high modulation bandwidth and complex modulation formats are especially influenced by the delay characteristics of FTDs. Accurate measurements of a FTD's delay characteristics are necessary to predict performance of a communication system. In addition, once delay of a FTD is accurately characterized, compensation for delay nonlinearities can be provided to improve performance of the communication system in which the FTD is included.

Measuring delay characteristics of a FTD using traditional techniques is time consuming. In a technique disclosed by Clark et al. in U.S. Pat. No. 5,937,006, three transmission measurements are performed on three pairs of interchanged FTDs to extract delay characteristics of a designated one of the FTDs. Performing multiple transmission measurements and interchanging FTDs as required by this technique is time consuming. In an alternative technique, delay characteristics of a FTD are obtained from phase comparison of an input modulated signal to a demodulated signal resulting at the output of the FTD. This modulation/demodulation technique is time consuming because phase comparisons are necessary at each of the frequencies at which the delay of the FTD is characterized. In addition, accuracy of this technique is limited by an inherent trade-off between resolution of the frequencies at which delay is characterized and time resolution of the resulting delay characterization.

In view of these known techniques, there is a need for a method for characterizing delay of FTDs that is accurate and quick to perform.

SUMMARY OF THE INVENTION

A method for characterizing delay of frequency translation devices (FTDs) constructed according to the preferred embodiments of the present invention is accurate and quick to perform. Absolute delay of a FTD is characterized by a method constructed according to a first embodiment of the present invention. In this first preferred embodiment, a stimulus signal is applied to a first port of the FTD. A second port of the FTD is coupled to a delay element having a known delay and a reflective termination. A drive signal is applied to a third port of the FTD. A time domain reflection response to the stimulus signal is obtained and a signal peak within the response, that corresponds to a return signal from the reflective termination, is identified. Absolute delay of the frequency translation device is then extracted based on the known delay of the delay element and a time that corresponds to the occurrence of the identified signal peak.

Delay of a FTD versus frequency is characterized by a method constructed according to a second preferred embodiment of the present invention. In this second preferred embodiment, a stimulus signal is also applied to a first port of the FTD while the second port of the FTD is coupled to the delay element and while a drive signal is applied to the third port of the FTD. A time domain reflection response to the stimulus signal is obtained and a segment of the obtained time domain reflection response that corresponds to a return signal from the reflective termination is isolated. Inverse frequency transforming the isolated segment of the time domain reflection response provides delay characteristics of the FTD versus frequency. Inherent frequency transform/inverse frequency transform relationships between the frequency domain and the time domain enable the delay characteristics of the FTD to be provided in equivalent alternative ways in the second preferred embodiment of the present invention.

DETAILED DESCRIPTION OF THE PREFERRED EMBODIMENTS

Figure 1:
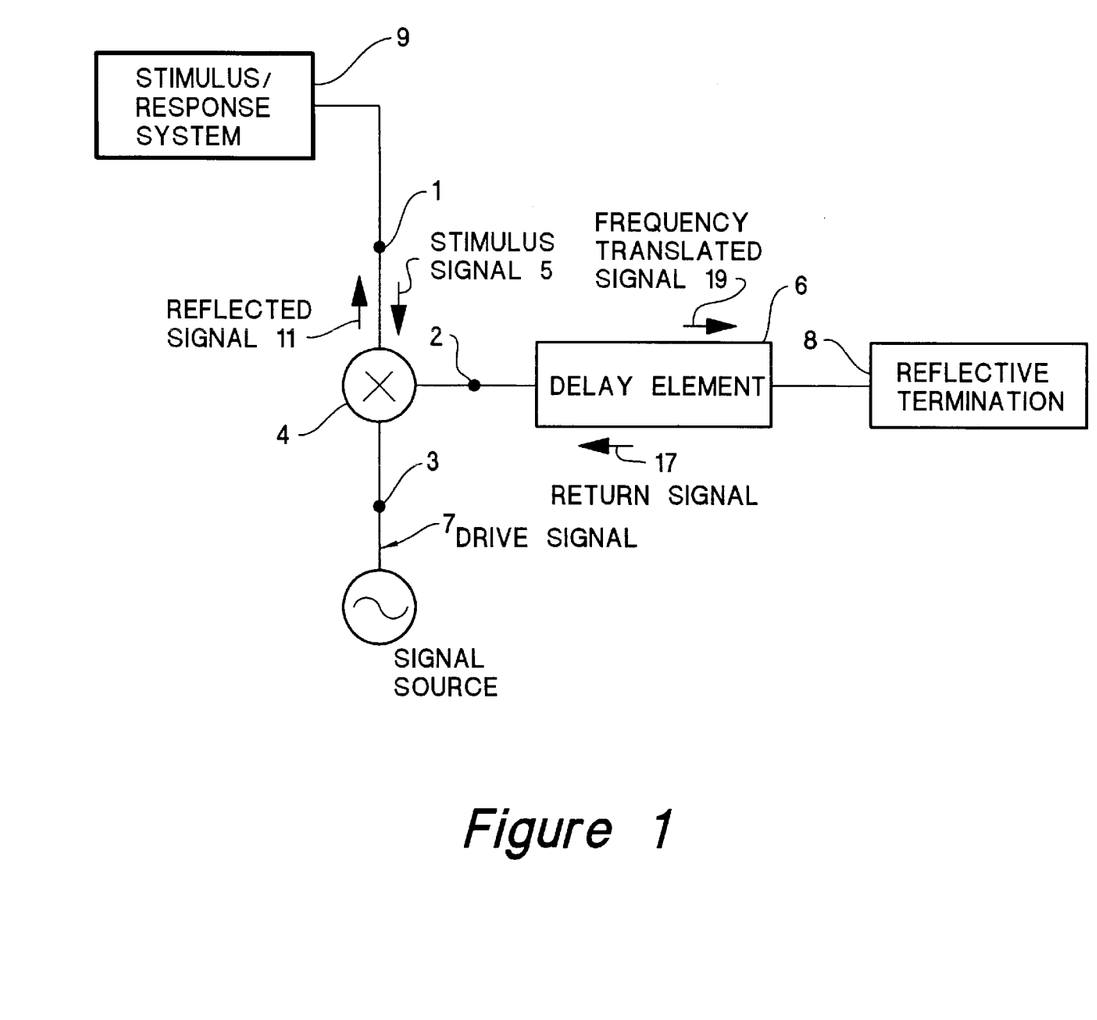
FIG. 1 shows a configuration of a frequency translation device (FTD) for use with the characterization method constructed according to the preferred embodiments of the present invention.

FIG. 1 shows a configuration of a frequency translation device (FTD) 4 for use with the characterization method constructed according to the preferred embodiments of the present invention. Typically, the FTD 4 is a mixer, modulator, system or component, that produces a frequency translated signal according to signals applied to the FTD 4. A first port 1 of the FTD 4 receives a stimulus signal 5. A second port 2 of the FTD 4 is coupled to a delay element 6. A third port 3 of the FTD 4 receives a drive signal 7, such as a local oscillator (LO) signal from a SIGNAL SOURCE. In this example, the FTD 4 is a broadband triple-balanced mixer where the first port 1 is the mixer's RF port, the second port 2 is the mixer's IF port, and the third port 3 is the mixer's LO port. Alternatively, the first port 1 is the mixer's IF port and the second port 2 is the mixer's RF port.

In the configuration of the FTD 4, the delay element 6 is an airline, dielectric loaded transmission line, or other type of electrical delay component. The delay element 6 has a propagation delay that is known, for example as a result of measurements or calculations. The delay element 6 is terminated in a reflective termination 8, such as an open circuit load or a short circuit load or other type of load sufficient to generate a return signal 17. Under condition that the stimulus signal 5 has a wide frequency bandwidth, the delay element is alternatively implemented as an inherent part of the FTD, such as a connector, internal transmission line or other structure within the FTD that introduces propagation delay. A stimulus/response system 9, such as a network analyzer or time-domain reflectometer (TDR), is coupled to the FTD 4.

Figure 2:
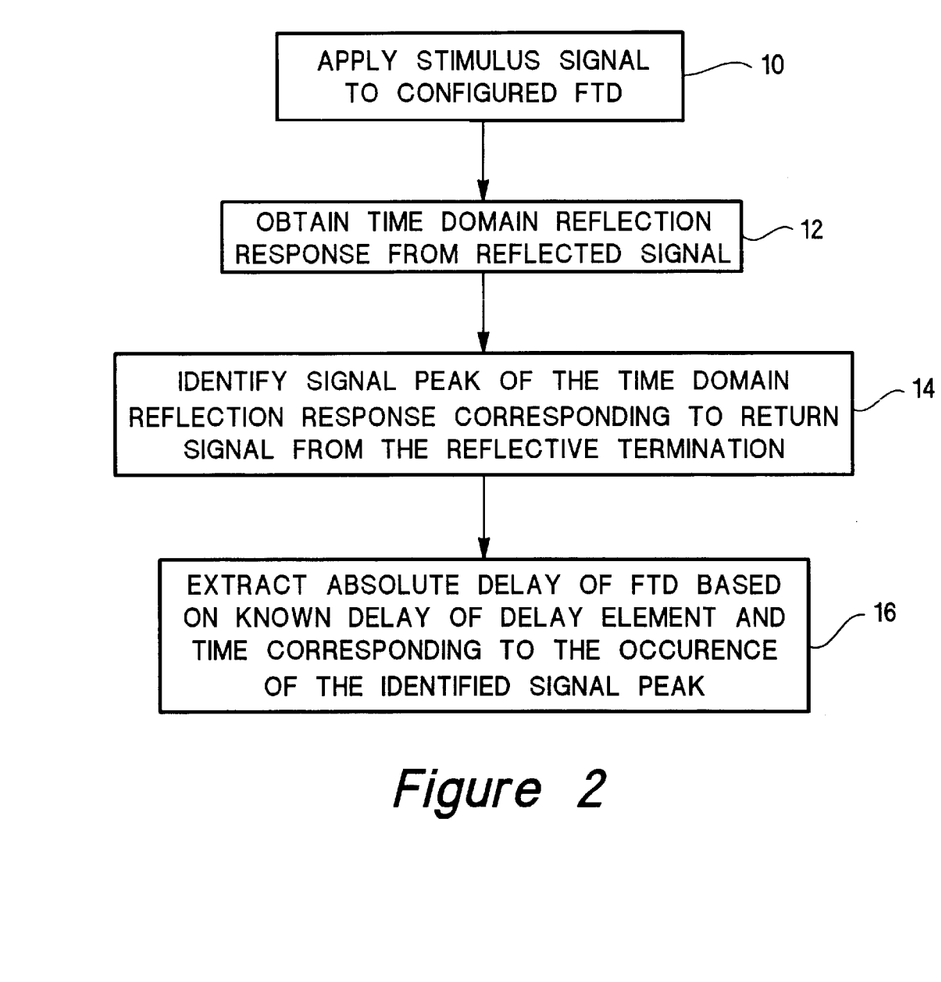
FIG. 2 is a flow diagram of a method for characterizing absolute delay of the FTD, constructed according to a first preferred embodiment of the present invention.

FIG. 2 is a flow diagram of a method for characterizing absolute delay of the FTD 4, constructed according to the first preferred embodiment of the present invention. In step 10 of the flow diagram, the stimulus signal 5 is applied to the first port 1 of the FTD 4, configured as in FIG. 1. The second port 2 of the FTD 4 is coupled to the delay element 6, and the drive signal 7 is applied to the third port 3 of the FTD 4. In step 12, a time domain reflection response to the stimulus signal 5 is obtained, based on a reflected signal 11 received by the stimulus/response system 9. The time domain reflection response is obtained in alternative ways. Under condition that the stimulus signal 5 is a swept signal, the time domain reflection response is obtained by measuring a frequency domain reflection response of the FTD 4 and inverse frequency transforming that frequency domain reflection response into the time domain. Under condition that the stimulus signal 5 is an impulse signal, the time domain reflection response is obtained by a direct time domain measurement of the reflected signal 11.

Figure 3:
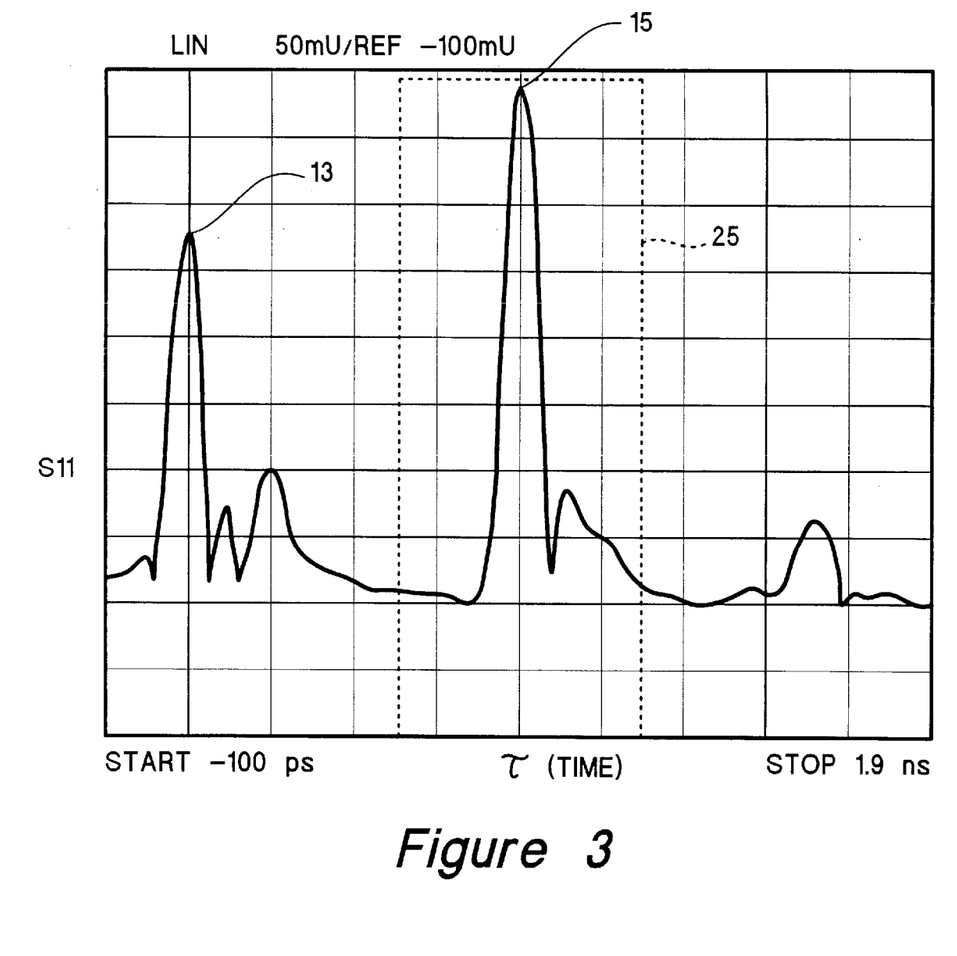
FIG. 3 shows a time domain reflection response for the configuration of FIG. 1.

The time domain reflection response obtained in step 12 is shown in FIG. 3 and has a first signal amplitude peak 13 and second signal amplitude peak 15. The first amplitude peak 13 corresponds to reflections of the stimulus signal 5 at various impedance discontinuities within the FTD 4 that are received by the stimulus/response system 9. The second amplitude peak 15 is from the return signal 17 from the reflective termination 8, that passes from the second port 2 of the FTD 4 to the first port 1 of the FTD 4, and that is then received by the stimulus/response system 9. The propagation delay of the delay element 6 is long enough to displace the second amplitude peak 15 from the first amplitude peak 13 in time, so that the amplitude peaks 13, 15 are distinguishable. Referring to FIG. 1, the applied stimulus signal 5 propagates from the first port 1 of the FTD 4 to the second port 2 to generate a frequency translated signal 19 that reflects off of the reflective termination 8. The return signal 17 results from this reflection of the frequency translated signal 19 off of the reflective termination. Propagation of the return signal 17 from port 2 to port 1 of the FTD 4 provides a reversal of the frequency translation that occurred from the prior propagation of the stimulus signal 5 from port 1 to port 2 of the FTD 4.

In step 14 of FIG. 2, the amplitude peak 15 of the time domain reflection response that corresponds to the return signal 17 from the reflective termination 8 is identified, based on the known propagation delay of the delay element 6. In step 16, the absolute delay of the FTD 4 is extracted based on the known delay of the delay element 6 and a time τ corresponding to the occurrence of the amplitude peak 15 identified in step 14. Since the time τ represents two times the delay of the delay element plus two times the absolute delay of the FTD 4, the extracted absolute delay is equal to half of the time τ corresponding to the occurrence of the identified amplitude peak, minus the known delay of the delay element 6.

The time resolution with which the absolute delay is extracted depends on the combined frequency bandwidth of the stimulus signal 5 and the drive signal 7. The combined frequency bandwidth is set wide enough to enable the absolute delay of the FTD 4 to be extracted with a predesignated time resolution. With the stimulus signal 5 as a swept signal and the drive signal 7 as a fixed frequency signal, the frequency range swept by the stimulus signal 5 is set sufficiently wide to achieve the predetermined time resolution. For example, with the drive signal 7 having a fixed frequency of 20 GHz and with the stimulus signal 5 swept over a 50 MHz to 10.05 GHz frequency range, the frequency bandwidth is 10 GHz, which provides a time resolution of approximately 100 picoseconds for the extracted absolute delay. With the drive signal 7 as a swept signal and the stimulus signal 5 as a fixed frequency signal, the frequency range swept by the drive signal 7 is set sufficiently wide to achieve the predetermined time resolution. Alternatively, with the stimulus signal 5 and the drive signal 7 both as swept signals, the combined frequency bandwidth of the signals is set sufficiently wide to achieve the predesignated time resolution.

Under condition that the stimulus signal 5 is an impulse signal, the frequency bandwidth of the impulse signal is sufficiently wide to enable the absolute delay of the FTD 4 to be extracted with the predesignated time resolution. Generally, wider frequency bandwidth provides correspondingly high time resolution.

Figure 4:
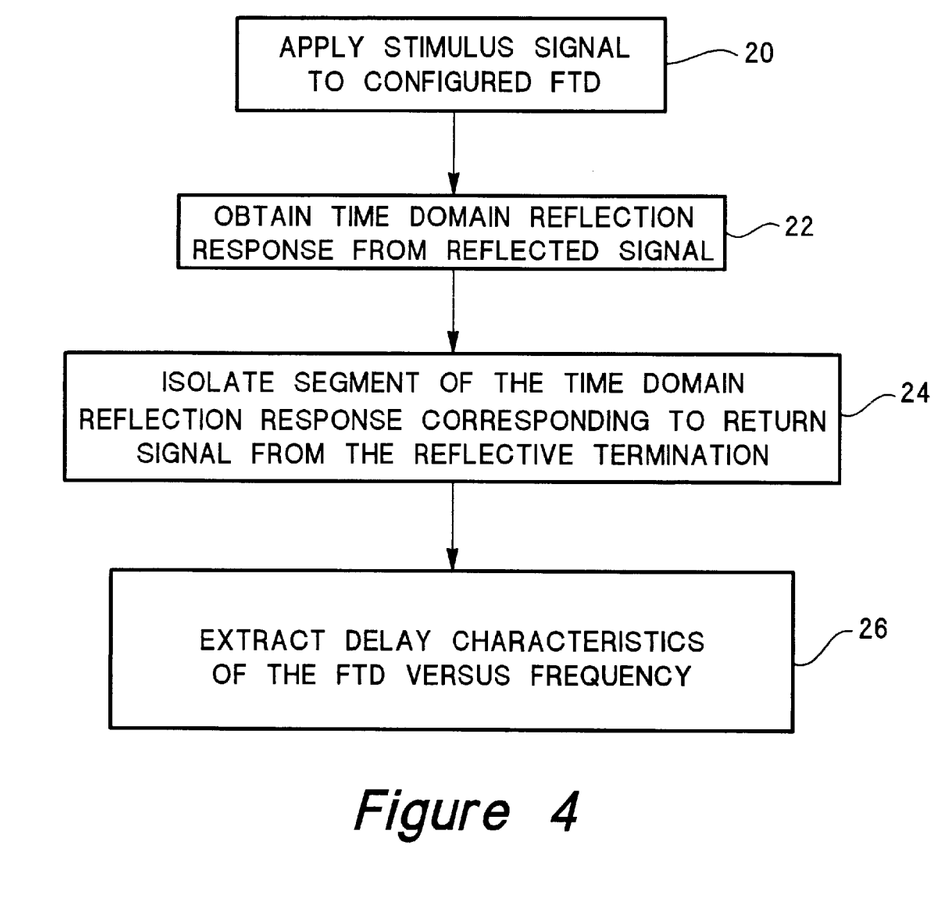
FIG. 4 is a flow diagram of a method for characterizing delay of the FTD versus frequency, constructed according to the second preferred embodiment of the present invention.

Figure 4 is a flow diagram of a method for characterizing delay of the FTD 4 versus frequency, constructed according to the second preferred embodiment of the present invention. In step 20 of the flow diagram, the stimulus signal 5 is applied to the first port 1 of the FTD 4, configured as in FIG. 1. The second port 2 of the FTD 4 is coupled to the delay element 6, and the drive signal 7 is applied to the third port 3 of the FTD 4. In step 22, a time domain reflection response to the stimulus signal 5 is obtained, based on the reflected signal 11 received by the stimulus/response system 9. The time domain reflection response is obtained in alternative ways. Under condition that the stimulus signal 5 is a swept signal, the time domain reflection response is obtained by measuring a frequency domain reflection response of the FTD 4 and then inverse frequency transforming that frequency domain reflection response into the time domain. Under condition that the stimulus signal 5 is an impulse signal, the time domain reflection response is obtained by a direct time domain measurement of the reflected signal 11. An example of the time domain reflection response obtained in step 22 is shown in FIG. 3.

Figure 5:
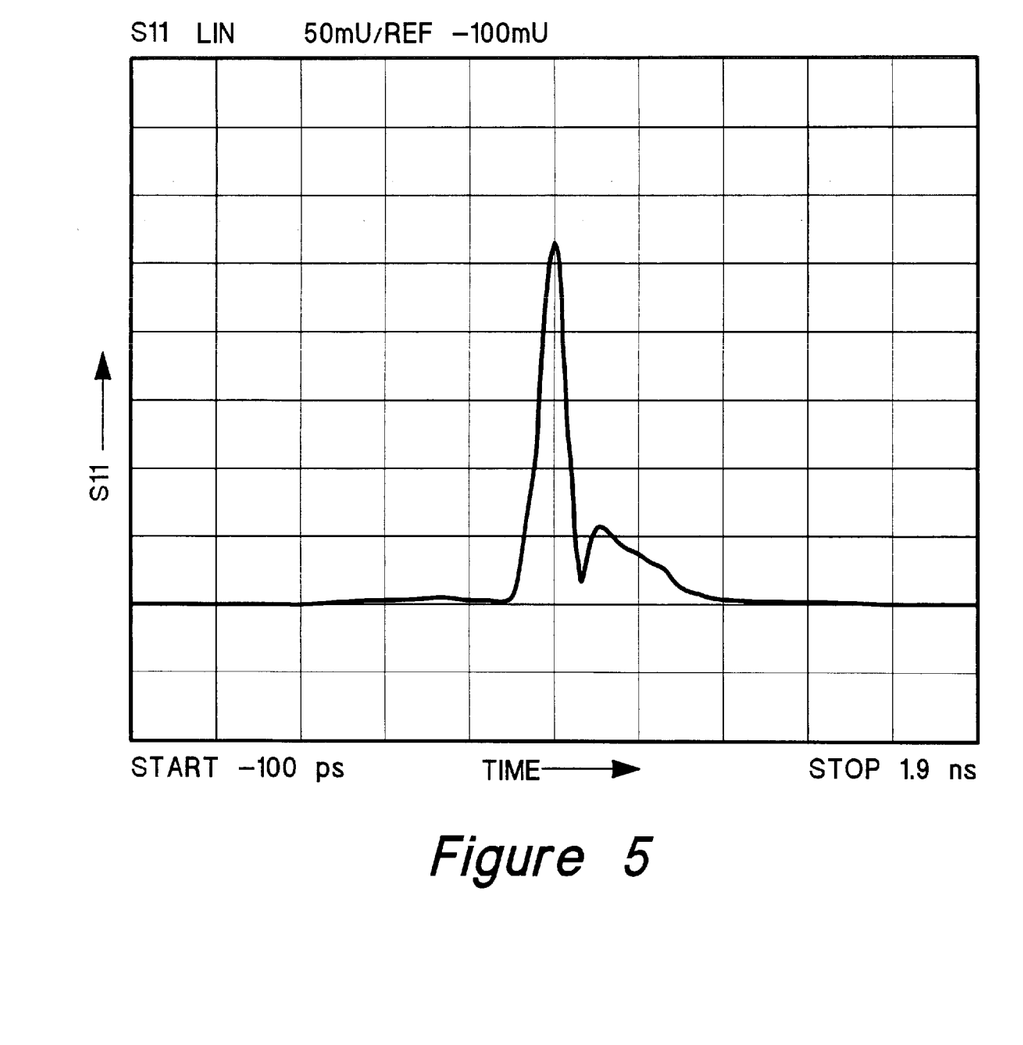
FIG. 5 shows an isolated segment of the time domain response shown in FIG. 3.

In step 24 of FIG. 4, a segment of the obtained time domain reflection response that corresponds to the return signal 17 from the reflective termination 8 is isolated. Isolation is achieved by applying to the obtained time domain reflection response, a gate 25 (shown in FIG. 3) such as a window or filter implemented in hardware or software. FIG. 5 shows the isolated segment of the time domain reflection response.

Figure 6:
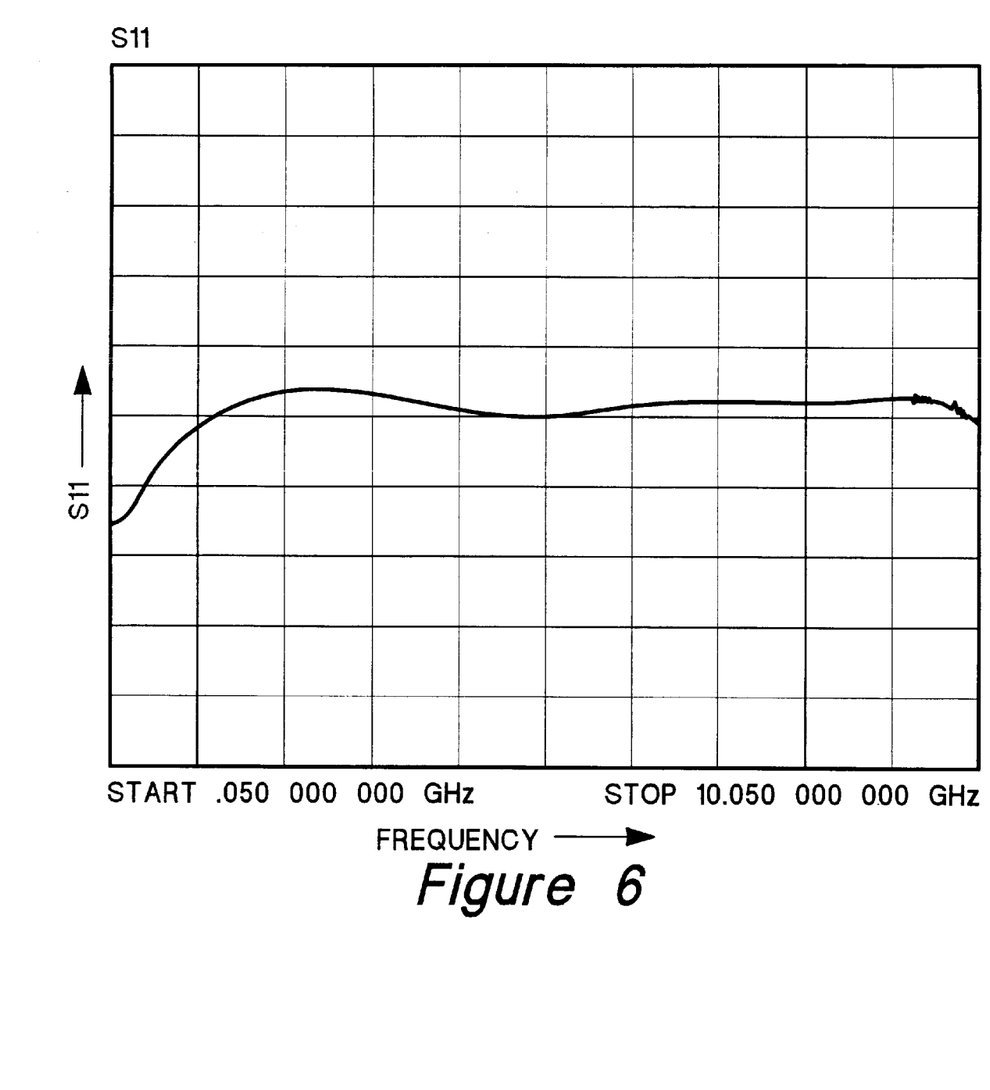
FIG. 6 shows delay characteristics of the FTD versus frequency, corresponding to the isolated segment of the time domain response shown in Figure 5.

In step 26 of FIG. 4, the delay characteristics of the FTD 4 versus frequency are extracted by frequency transforming the isolated portion of the time domain reflection response into the frequency domain. The extracted delay characteristics versus frequency resulting from steps 20–26 are shown in FIG. 6.

Known frequency transform/inverse frequency transform relationships exist between the frequency domain and the time domain. Frequency transforms, such as Fourier Transforms, Fast Fourier Transforms, z Transforms, Chirp Z transforms are examples of known frequency transforms that provide conversion from the time domain to the frequency domain. Inverse frequency transforms provide corresponding conversion from the frequency domain to the time domain. Based on these inherent relationships between the frequency domain and the time domain, steps 22–26 of FIG. 4 are equivalently implemented in alternative ways. In a first alternative, step 24 and step 26 are implemented by applying the gate 25 to the segment of the time domain reflection response that corresponds to the return signal 17 from the reflective termination 8, frequency transforming the time domain reflection response, inverse frequency transforming the gate 25 and convolving the frequency transform of the time domain reflection response with the inverse frequency transform of the gate to provide delay characteristics of the FTD 4.

In a second alternative, step 24 and step 26 are implemented by designating the gate 25 according to the delay of the delay element and the absolute delay of the FTD 4, which is measured, estimated or approximated, and convolving the frequency domain reflection response with an inverse frequency transform of the gate 25 to provide delay characteristics of the FTD 4.

The time resolution of the delay characterization depends on the combined frequency bandwidth of the stimulus signal 5 and the drive signal 7. The combined frequency bandwidth is set wide enough to enable the delay of the FTD 4 to be characterized with a predesignated time resolution. With the stimulus signal 5 as a swept signal and the drive signal 7 as a fixed frequency signal, the frequency range swept by the stimulus signal 5 is set sufficiently wide to achieve the predetermined time resolution. For example, with the drive signal 7 having a fixed frequency of 20 GHz and with the stimulus signal 5 swept over a 50 MHz to 10.05 GHz frequency range, the frequency bandwidth is 10 GHz, which provides a time resolution of approximately 100 picoseconds for the characterized delay. With the drive signal 7 as a swept signal and the stimulus signal 5 as a fixed frequency signal, the frequency range swept by the drive signal 7 is set sufficiently wide to achieve the predetermined time resolution. Alternatively, with the stimulus signal 5 and the drive signal 7 both as swept signals, the combined frequency bandwidth of the signals is set sufficiently wide to achieve the predesignated time resolution. Under condition that the stimulus signal 5 is an impulse signal, the frequency bandwidth of the impulse signal is sufficiently wide to enable the delay of the FTD 4 to be characterized with the predesignated time resolution. Generally, wider frequency bandwidth provides correspondingly high time resolution.

The frequency transforming, gate application, inverse frequency transforming or convolving within the preferred embodiments of the present invention are performed by the stimulus/response system 9, such as a network analyzer or time domain reflectometer having these capabilities. Alternatively, the frequency transforming, inverse frequency transforming, gate application, or convolving are performed by an external computer or signal processor coupled to the stimulus/response system 9.

While the preferred embodiments of the present invention have been illustrated in detail, it should be apparent that modifications and adaptations to these embodiments may occur to one skilled in the art without departing from the scope of the present invention as set forth in the following claims.

What is claimed is:

1. A method for characterizing delay of a frequency translation device versus frequency, comprising:
   applying a stimulus signal to a first port of the frequency translation device, while a second port of the frequency translation device is coupled to a delay element having a known delay and having a reflective termination, and while a drive signal is applied to a third port of the frequency translation device;
   obtaining a time domain reflection response to the stimulus signal;
   isolating a segment of the time domain reflection response corresponding to a return signal from the reflective termination; and
   performing an inverse frequency transform on the isolated segment of the time domain reflection response to provide delay characteristics of the frequency translation device versus frequency.

2. The method of claim 1 wherein the stimulus signal and the drive signal have a combined bandwidth sufficiently wide to provide delay characteristics of the frequency translation device having at least a predesignated time resolution.

3. The method of claim 1 wherein isolating the segment of the time domain reflection response is performed by gating the time domain reflection response.

4. The method of claim 3 wherein the stimulus signal is provided by a network analyzer, the time domain reflection response is obtained by the network analyzer, and wherein at least one of the gating and the inverse frequency transforming is performed by the network analyzer.

5. The method of claim 3 wherein the stimulus signal is provided by a time domain reflectometer and the time domain reflection response is obtained by the time domain reflectometer.

6. A method for characterizing delay of a frequency translation device versus frequency, comprising:
   applying a stimulus signal to a first port of the frequency translation device, while a second port of the frequency translation device is coupled to a delay element having a reflective termination, and while a drive signal is applied to a third port of the frequency translation device, the delay element having a known delay;
   obtaining a time domain reflection response to the stimulus signal;
   applying a gate to isolate a segment of the time domain reflection response corresponding to a return signal from the reflective termination;
   frequency transforming the time domain reflection response and inverse frequency transforming the gate; and
   convolving the frequency transform of the time domain reflection response with the inverse frequency transform of the gate to provide delay characteristics of the frequency translation device versus frequency.

7. The method of claim 6 wherein the stimulus signal and the drive signal have a combined bandwidth sufficiently wide to provide delay characteristics of the frequency translation device having at least a predesignated time resolution.

8. The method of claim 6 wherein the stimulus signal is provided by a network analyzer, the time domain reflection response is obtained by the network analyzer, and wherein at least one of the application of the gate, the frequency transforming, the inverse frequency transforming, and the convolving is performed by the network analyzer.

9. A method for characterizing delay of a frequency translation device versus frequency, comprising:
   applying a stimulus signal to a first port of the frequency translation device, while a second port of the frequency translation device is coupled to a delay element having a reflective termination, and while a drive signal is applied to a third port of the frequency translation device;
   obtaining a frequency domain reflection response to the stimulus signal;

designating a gate according to a delay of the delay element and an absolute delay of the frequency translation device; and convolving the frequency domain reflection response with an inverse frequency transform of the designated gate to provide delay characteristics of the frequency translation device versus frequency.

11. The method of claim 9 wherein the stimulus signal and the drive signal have a combined bandwidth sufficiently wide to provide delay characteristics having at least a predesignated time resolution.

11. The method of claim 9 wherein the stimulus signal is provided by a network analyzer, the time domain reflection response is obtained by the network analyzer, and wherein at least one of the inverse frequency transforming and the convolving is performed by the network analyzer.

* * * * *